(12) United States Patent
Espalin et al.

(10) Patent No.: US 10,582,619 B2
(45) Date of Patent: Mar. 3, 2020

(54) APPARATUS FOR WIRE HANDLING AND EMBEDDING ON AND WITHIN 3D PRINTED PARTS

(71) Applicant: Board of Regents, The University of Texas System, Austin, TX (US)

(72) Inventors: David Espalin, El Paso, TX (US); Daniel Marquez, El Paso, TX (US); Alfonso Fernandez, El Paso, TX (US); Chiyen Kim, El Paso, TX (US); Eric MacDonald, El Paso, TX (US); Ryan Wicker, El Paso, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 279 days.

(21) Appl. No.: 15/244,061

(22) Filed: Aug. 23, 2016

(65) Prior Publication Data

US 2017/0064840 A1      Mar. 2, 2017

Related U.S. Application Data

(60) Provisional application No. 62/209,067, filed on Aug. 24, 2015.

(51) Int. Cl.
*H05K 3/10* (2006.01)
*B33Y 80/00* (2015.01)

(52) U.S. Cl.
CPC .............. *H05K 3/103* (2013.01); *B33Y 80/00* (2014.12); *H05K 2203/0195* (2013.01); *H05K 2203/163* (2013.01)

(58) Field of Classification Search
CPC .... H05B 3/86; H05B 2203/017; H05K 3/103; H05K 2203/0195
See application file for complete search history.

(56) References Cited

U.S. PATENT DOCUMENTS 5,891,280 A * 4/1999 Gillner ................. H05B 3/86
156/250
6,113,696 A    9/2000 Tseng
(Continued)

FOREIGN PATENT DOCUMENTS

EP          0443691 A2 *   8/1991  ............... H05B 3/86

OTHER PUBLICATIONS

Bayless et al., "Wire Embedding 3D Printer", Apr. 12, 2010, Engineering Physics, University of British Columbia.*

*Primary Examiner* — Livius R. Cazan
(74) *Attorney, Agent, or Firm* — Yee & Associates, P.C.

(57) ABSTRACT

An apparatus, system, and method for automatically dispensing and embedding components into three-dimensional parts. In an example embodiment, a direct wire embedding head can be fixed on an automation motion system. The direct wire embedding head begins and terminates an embedded wire pattern on a layer or on a surface of a three-dimensional part in order to automatically create the embedded wire pattern. A sensor is located on an embedding surface wherein the embedded wire pattern is embedded. The sensor can measure the distance between the direct wire embedding head and the embedding surface. A predefined distance can be maintained to ensure successful embedding results for the embedded wire pattern by automatically adjusting a position of the direct wire embedding head in response to feedback from the sensor.

12 Claims, 4 Drawing Sheets

(56) References Cited

U.S. PATENT DOCUMENTS

| | | |
|---|---|---|
| 7,291,002 B2 | 11/2007 | Russell et al. |
| 8,827,684 B1 | 9/2014 | Schumacher et al. |
| 2006/0156978 A1* | 7/2006 | Lipson .................. A61L 27/36 <br> 118/708 |
| 2008/0314626 A1* | 12/2008 | Moore .................. G06F 3/0412 <br> 174/255 |
| 2013/0170171 A1 | 7/2013 | Wicker et al. |
| 2014/0242208 A1 | 8/2014 | Elsworthy |
| 2014/0268604 A1 | 9/2014 | Wicker et al. |
| 2014/0268607 A1 | 9/2014 | Wicker et al. |
| 2014/0316546 A1 | 10/2014 | Walsh et al. |
| 2014/0374933 A1 | 12/2014 | Flitsch et al. |
| 2015/0014885 A1 | 1/2015 | Hofmann et al. |
| 2015/0021830 A1 | 1/2015 | Yerazunis et al. |
| 2015/0077215 A1 | 3/2015 | Ranky et al. |

\* cited by examiner

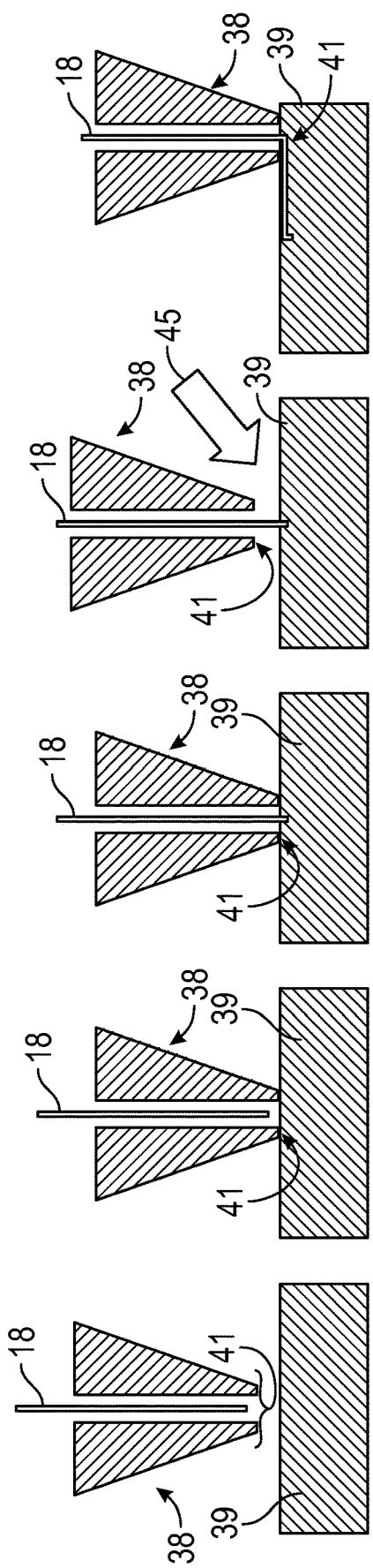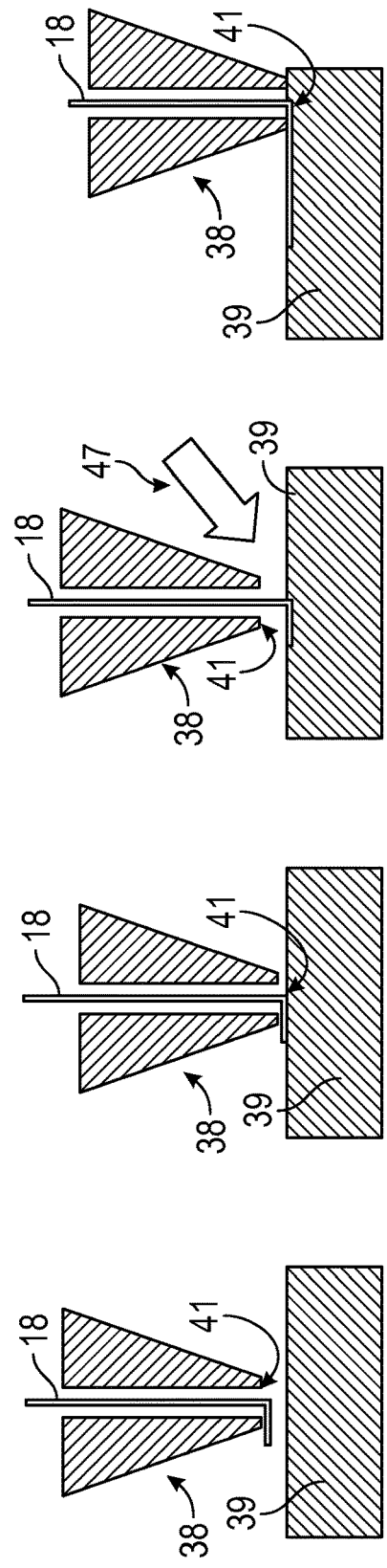

APPARATUS FOR WIRE HANDLING AND EMBEDDING ON AND WITHIN 3D PRINTED PARTS

CROSS-REFERENCE TO PROVISIONAL APPLICATION

This nonprovisional patent application claims the benefit under 35 U.S.C. § 119(e) of U.S. Provisional Patent Application Ser. No. 62/209,067 filed on Aug. 24, 2015, entitled "Method and Apparatus for Wire Handling and Embedding On and Within 3D Printed Parts". U.S. Provisional Patent Application Ser. No. 62/209,067 is incorporated herein by reference in its entirety.

TECHNICAL FIELD

Embodiments are related to the manufacturing of three-dimensional products with embedded wires through the use of Additive Manufacturing (also known as 3D Printing, Layer Manufacturing, Rapid Manufacturing, and Direct Digital Manufacturing).

BACKGROUND 3D printing is an additive manufacturing process for making three-dimensional objects of arbitrary shapes from digital models. Other terms used synonymously to refer to 3D printing include additive manufacturing, layer manufacturing, rapid prototyping, layer-wise fabrication, solid freeform fabrication, and direct digital manufacturing. In 3D printing, successive layers of a material are laid down adjacently to form the objects. Material extrusion or fused deposition modeling typically involve a round or ribbon like material that is extruded through a movable nozzle.

The manufacturing method, since it deposits one layer at a time, allows access to each individual layer. Opportunities arise when this access is provided. For example, complementary technologies can be introduced at every layer to improve the functionality of the final part. Such complementary technologies include electronics, electromagnetic structures, or reinforcement structures. To include these technologies at every layer or on the surface of the 3D printed part, the direct wire embedding head is used to create wire patterns on and within 3D printed parts.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings and abstract as a whole.

It is, therefore, one aspect of the disclosed embodiments to provide for an apparatus, system, and method for the manufacture of three-dimensional products.

It is another aspect of the disclosed embodiments to provide for an apparatus, system, and method for wire handling and embedding on and within 3D printed parts.

It is yet another aspect of the disclosed embodiments to provide for an improved direct wire embedding head utilized in 3D printing.

The aforementioned aspects and other objectives and advantages can now be achieved as described herein. An apparatus, system, and method for automatically dispensing and embedding components into three-dimensional parts are disclosed. In an example embodiment, a direct wire embedding head can be fixed on an automation motion system. Such a direct wire embedding head begins and terminates an embedded wire pattern on a layer or on a surface of a three-dimensional part in order to automatically create the embedded wire pattern.

In another example embodiment, a sensor can be located on an embedding surface wherein the embedded wire pattern is embedded. The sensor measures the distance between the direct wire embedding head and the embedding surface. A predefined distance can be maintained to ensure successful embedding results for the embedded wire pattern by automatically adjusting a position of the direct wire embedding head in response to feedback from the sensor.

The automation motion system creates a wire pattern on a layer and on the surface of the 3D printed part. Note that the surface of the part is not relegated to a planar surface; instead, the surface can be curved or freeform. The automation motion system can be implemented as, for example, a three-axis gantry system, a four-axis motion system, a five-axis motion system, a robotic six-axis motion system, or similar motion system. The wire pattern on the layer or on the surface of an object can function as interconnections between, for example, electronic components, electromagnetic device, and/or a mechanical reinforcement. The wire can be composed of, for example, copper, stainless steel, nickel chromium, monel, nickel titanium, Kevlar, co-axial wire, optical fiber, or another similar material.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 3(a) illustrates an operation in which a wire is placed either within a direct wire embedding head such that it is slightly inside the tip, but not beyond the orifice, or just outside the orifice, in accordance with an alternative embodiment;

FIG. 3(b) illustrates an operation in which the direct wire embedding head is moved towards a plastic surface until the orifice is close to or in contact with the plastic, in accordance with an alternative embodiment;

FIG. 3(c) illustrates an operation in which during a dwelling time, the wire is advanced beyond the tip's orifice so that the wire is submerged into melted or softened plastic, in accordance with an alternative embodiment;

FIG. 3(d) illustrates an operation in which after the dwell time, the direct wire embedding head is moved away from the surface of the plastic while simultaneously supplying a cooling fluid to freeze or harden the softened plastic and advancing the wire further to mitigate tension in the wire that may cause into detach from the molten plastic, in accordance with an alternative embodiment;

FIG. 3(e) illustrates an operation in which after the starting point is established, the hot orifice is brought back to the plastic surface and immediately traversed by an automation motion system while advancing the wire forward to create the wire pattern, in accordance with an alternative embodiment;

FIG. 4(a) illustrates an operation in which the wire is located outside the orifice, in accordance with an alternative embodiment;

FIG. 4(b) illustrates an operation in which the tip locally melts the plastic, in accordance with an alternative embodiment;

FIG. 4(c) illustrates an operation in which after initially embedding the wire, the tip is moved away from the surface while the wire is advanced and cooling air is supplied to the embedding area, in accordance with an alternative embodiment;

FIG. 4(d) illustrates an operation in which the tip is brought back to the plastic's surface and traversed to create a wiring pattern, in accordance with an alternative embodiment;

DETAILED DESCRIPTION

Figure 1:
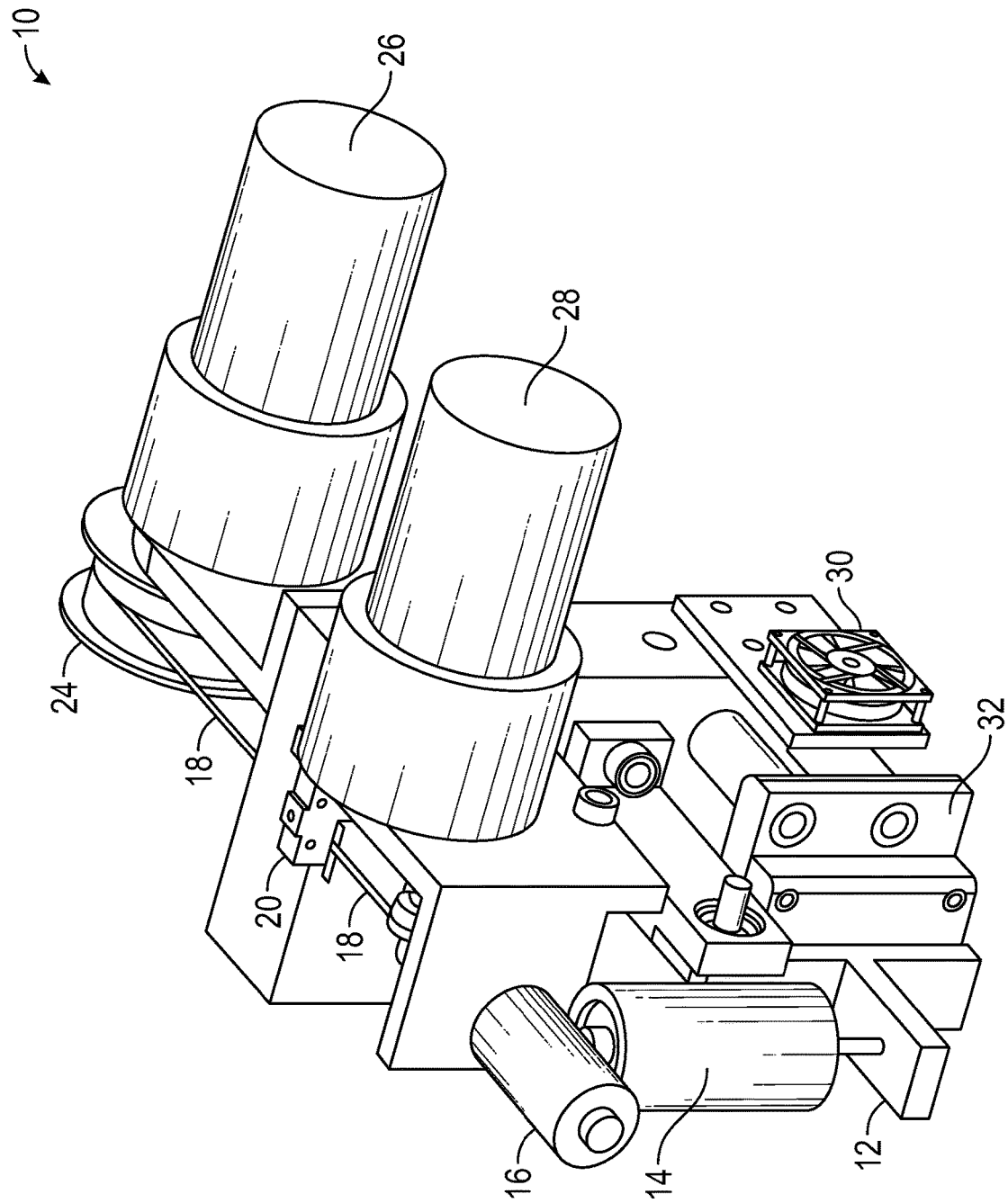
FIG. 1 illustrates a perspective view of a direct wire embedding head, in accordance with a preferred embodiment.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. For example, preferred and alternative embodiments are disclosed herein.

Additionally, like numbers refer to identical, like, or similar elements throughout, although such numbers may be referenced in the context of different embodiments. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

There presently does not exist an apparatus for automatically dispensing and embedding wires or filaments into 3D printed parts. The wire pattern within the object can function as interconnections between electronic components, an electromagnetic device, a heating element, a heat dissipating element, and/or a mechanical reinforcement for a 3D printed plastic part. A particular problem with embedding wires in 3D printed parts is the action of starting a wire pattern and terminating that pattern. The problem of starting a wire pattern is solved by encapsulating one end of a wire in the plastic before embedding the remaining wire. This can be accomplished by locally melting or softening the plastic and placing the wire in the molten material.

Subsequently, air can be utilized to cool the molten material to encapsulate and fix the end of the wire in the plastic. The problem of terminating a wire pattern is solved by pressing the sharp edge of a cutting knife against the embedded wire so that the wire is either cut or damaged and easily pulled apart at the damaged area. To facilitate the creation of the wire pattern, the direct wire embedding head is fixed on an automation motion system so that a CAD (computer-aided design) application or solution can be utilized to easily create tool path instructions and the wire pattern can be created automatically. Inconsistencies in the part geometry can be compensated for by using a sensor on the embedding surface that measures the distance between the direct wire embedding head and the surface. A predefined distance can be maintained to ensure successful embedding results by adjusting the position of the head in response to the sensor's feedback.

The disclosed embodiments allow for automatically starting and terminating an embedded wire pattern on a layer or on the surface of 3D printed parts. As will be explained in greater detail herein, an apparatus can be implemented, which utilizes an automation motion system to create a wire pattern on a layer and on the surface of the 3D printed part. The automation motion system can be implemented as, for example, a three-axis gantry system, a four-axis motion system, a five-axis motion system, a robotic six-axis motion system, or similar motion system. The wire pattern on the layer or on the surface of an object can function as interconnections between, for example, electronic components, electromagnetic device, and/or a mechanical reinforcement. The wire can be composed of, for example, copper, stainless steel, nickel chromium, monel, nickel titanium, Kevlar, co-axial wire, optical fiber, or another similar material.

FIG. 1 illustrates a perspective view of a direct wire embedding head 10, in accordance with a preferred embodiment. The direct wire embedding head 10 includes a wire spool 24 upon which a wire 18 is spooled. The wire 18 moves through a switch sensor 20. A wire idler roller actuator 16 is located above a cutter actuator 14 and also to a wire drive motor 28. A spool motor 28 assists in driving the wire spool 24. The direct wire embedding head 10 further includes a knife bracket 12 located below the cutter actuator 14. A heating block 32 is located between the knife bracket 12 and cooling fans 30.

Figure 2:
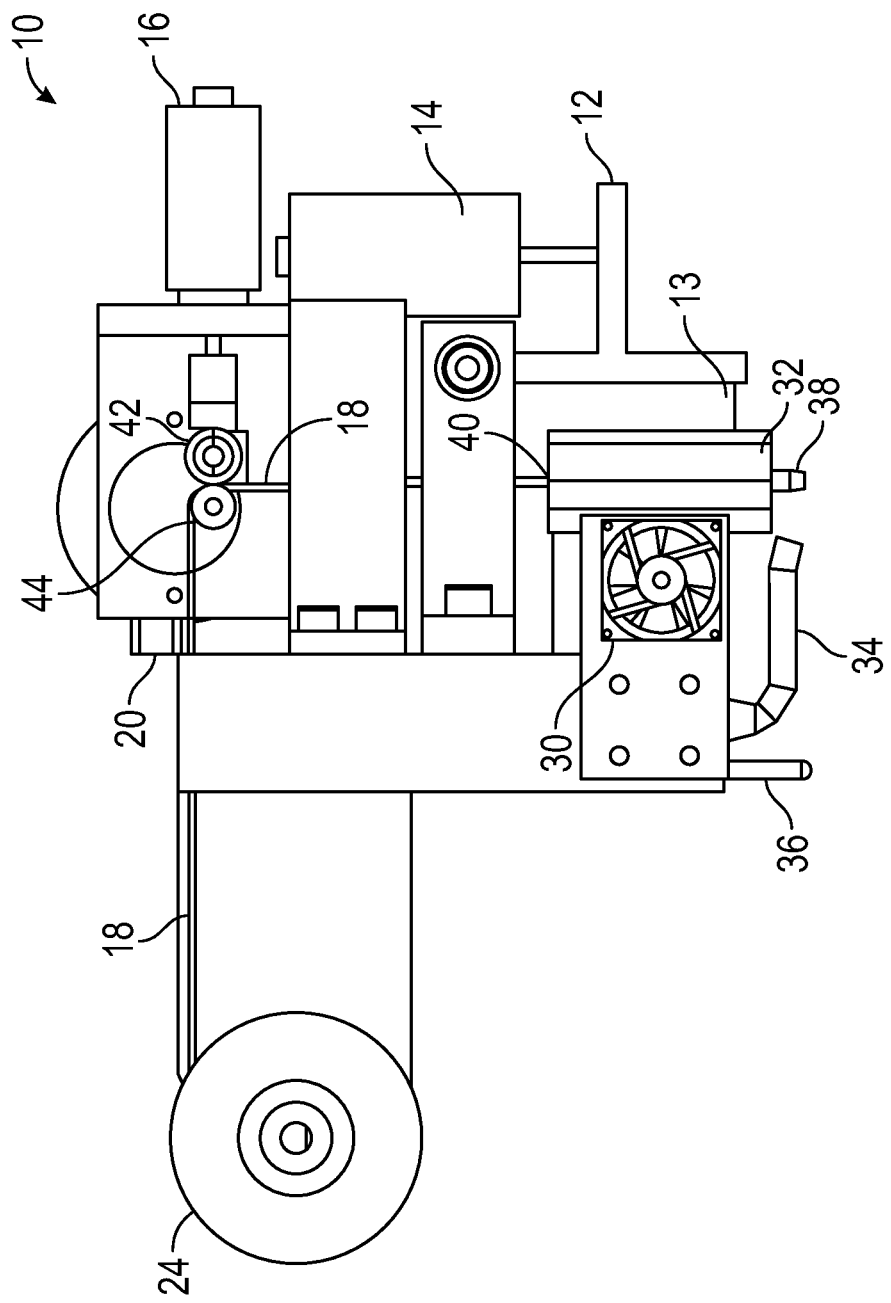
FIG. 2 illustrates a side view of the direct wire embedding head depicted in FIG. 1, in accordance with a preferred embodiment.

FIG. 2 illustrates a side view of the direct wire embedding head 10 depicted in FIG. 1, in accordance with a preferred embodiment. Note that in FIGS. 1-2, identical or similar parts are indicated by identical reference numerals. The side view depicted in FIG. 2 additionally shows a cooling nozzle 34 disposed relative to the cooling fans 30. A distance sensor 38 is shown in FIG. 2 as located to left of the cooling nozzle 34. An exit tip 38 is located below the heating block 32. A cutting knife 13 is located to the right of the heating block 32 and below the knife bracket 12. A wire guide 40 is also depicted in FIG. 2 for guiding wire 18. The direct wire embedding head 10 further includes a wire idler roller 42 and a wire drive roller 44 with respect to the wire 18.

The configuration shown in FIGS. 1-2 represents the direct wire embedding head 10 that handles the wire 18 and locally heats both the wire 18 and plastic material. The wire spool 24 is contained on a spool bolder, which is composed of a spool roller and the spool motor 26. The wire 18 is routed through the switch sensor 20 so that tension in the wire 18 can be detected. The wire 18 is continued to be routed to the wire driver roller 44 that is attached to the wire drive motor 28. This motor 28, in combination with the wire driver roller 44 and the wire idler roller 42, can be utilized to feed the wire 18 through the heated section of the direct wire embedding head 10.

When the wire drive motor 28 is required, the wire idler roller 42 is actuated (by the wire idler roller actuator 16) so that the idler roller 42 makes tangential contact with the wire driver roller 44. This allows the wire 18 to be pinched between both the wire driver roller 44 and the idler roller 42. The wire 18 is driven by the rotating pinch rollers and the direction of the rotation determines whether the wire 18 is being pushed (or advanced) out of the tip 38 or being pulled back in (or retracted).

During advanced motion (i.e., the wire 18 being fed out of the tip), the wire 18 travels through a wire guide (e.g., a stainless steel hypodermic tube, or the material and type of tube may be something else) and past the heating block 32. In the heating block 32 are two cartridge heaters and a thermocouple, which are connected to a temperature controller so that the heating block is maintained at a prescribed temperature. The heating block 32 conducts heat to the wire guide, the exit tip 38, and the wire 18 to be embedded. The heating block 32 and the exit tip 38 may be designed using thermal analysis and simulation tools to ensure efficient transfer of heat from the cartridge heaters to the tip's exit orifice.

The heating block 32 and the wire guide are insulated from the surrounding environment to efficiently maintain a consistent temperature. The cutting knife 13 can be used for cutting the wire 18 within the heating block 32. The knife 13 can be mounted to the knife bracket 12 and is actuated by the cutter actuator 14. An alternative embodiment or configuration of the cutting knife 13 can involve placing the knife 13 external to the heated section and cutting the wire 18 while on the plastic substrate. In this alternative configuration, the cutting knife 13 can be attached to the head and kept away from the orifice so that it is not an obstruction during embedding of the wire 18.

The cooling nozzle 34 delivers air or other cooling fluids and can be included on the direct wire embedding head to locally cool the exiting wire 18 or plastic directly under the head. Additionally, to ensure that the head mounting bracket remains relatively cool, the set of cooling fans 30 can be utilized to circulate air between the heating block 32 and the bracket 12.

The problem of starting a wire pattern can be solved by encapsulating or embedding one end of the wire 18 in plastic before embedding the remaining wire 18, as shown in FIGS. 3(*a*)-3(*e*). This can be accomplished by locally melting or softening the plastic and placing the wire 18 in the molten material. The wire 18 is placed either within the head such that it is slightly inside the tip 38 as illustrated in FIG. 3(*a*), but not beyond the orifice 41 or just outside the orifice 41. The direct wire embedding head is moved towards the plastic surface 39 as shown in FIG. 3(*b*) until the orifice is close to or in contact with the plastic 39. Note that experiments have been performed by the present inventors with thick wires which indicates that the orifice does not necessarily have to be placed in contact with the plastic. That is, the inventors have found that it is only necessary in some situations to place the orifice close enough to the plastic so that the hot wire is submerged into the plastic.

The orifice 41 is held or dwelled at the surface for a prescribed period of time that is dependent on the tip's temperature, the plastic material, and the diameter of the wire. During the dwelling time, the wire 18 is advanced beyond the tip's orifice 41 as depicted in FIG. 3(*c*) so that the wire 18 is submerged into melted or softened plastic. After the dwell time, the direct wire embedding head is moved away from the surface of the plastic as indicated in FIG. 3(*d*) while the wire 18 is advanced further to mitigate tension in the wire 18 that may cause it to detach from the molten plastic.

Simultaneously, a stream of air or other cooling fluid at room temperature or colder) as indicated by arrow 45 is locally supplied to the molten plastic and wire to cause freezing or hardening of the plastic as shown in FIG. 3(*d*). This causes the wire 18 to become fixed in the plastic and ensures a starting point of the pattern. If the wire is not fixed in a hard portion of plastic at the starting point, the wire is simply dragged on the surface and the pattern is not produced as desired.

After the starting point is established, the hot orifice 41 is brought back to the plastic surface 39 and immediately traversed as shown in FIG. 3(*e*) by an automation motion system while advancing the wire 18 forward to create the wire pattern. The tooling head is traversed in three-dimensional space to create the desired wire pattern. Alternatively, the direct wire embedding head can be traversed while disengaging the wire idler rollers. Since the wire 18 is fixed at the start position, the head can traverse and the wire is self-feeding due to the tension in the wire 18. The combination of heat supplied by the heating block and pressure produced by the tip being against the plastic ensures that the wire pattern is created and embedded in the plastic.

If the wire is slightly outside the orifice 41 before embedding commences, a similar process is followed, as shown in FIGS. 4(*a*)-4(*d*). The wire 18 is located outside the orifice 41 as shown in FIG. 4(*a*) and the tip 38 locally melts the plastic as depicted in FIG. 4(*b*). After initially embedding the wire 18, the tip 38 is moved away from the surface while the wire 18 is advanced and cooling air (i.e., see arrow 47, which is representative of such cooling air) is supplied to the embedding area as illustrated in FIG. 4(*c*). Finally, the tip 41 is brought back to the plastic's surface and traversed to create the wiring pattern as shown in FIG. 4(*d*).

The problem of terminating a wire pattern is solved by pressing the sharp edge of the cutting knife 13 against the wire 18 so that the wire 18 is either cut or damaged so that it is easily pulled apart at the damaged area. To accomplish this, the cutter is actuated via the cutter actuator 14 so that the cutting knife 13 comes in contact with the wire 18 within the heating block 32. The cutting knife 13 can be of multiple shapes and sizes including precision blades, fine point blade, curved carving blade, scoring blade, chiseling blade, stripping blade, deburring blade, contoured blade, concave carving blade, v-groove cutting blade, notched cutting blade, or any other cutting blade.

Alternatively, the tool head may embed a wire pattern that is slightly longer than what was desired. In alternative embodiment, for example, the tooling head can then be moved away from the plastic surface to allow the cutting knife 13 to access the wire pattern. The cutting knife 13 can then be actuated so that the embedded wire 18 is cut or damaged. The unembedded wire 18 is then pulled (either by moving the tool head away from the surface while holding the unembedded wire firmly with the wire drive and idler rollers, by retracting the unembedded wire with the wire rollers 41 or 42, or any combination thereof) and broken at the spot where the cutting knife 13 made contact with the wire 18. The termination of the wire 18 is performed on the embedded wire 18 so that the wire 18 is fixed and will not move while being cut. This ensures an accurate position for the termination of the pattern. Air can also be supplied by the cooling nozzle 34 during any portion of the wire termination process so that the wire 18 does not move within the molten plastic.

The wire patterns created by the tool head can vary in shape and size. To ensure that the wire 18 exiting the orifice 41 is held in the molten plastic at the desired location, the cooling nozzle 34 can be selectively utilized to encapsulate and fix the wire 18 after exiting the orifice 41. This is especially important when the wire pattern contains sharp corners or small diameters that require the traversing motion to decelerate and accelerate resulting in longer exposures to the hot orifice. Additionally, a combination of cooling fluid (including air) and momentary separation from the plastic surface can be used to control the final wire pattern results. The motion system can also vary the traversing speed during embedding to ensure desired embedding results.

Figure 5A:
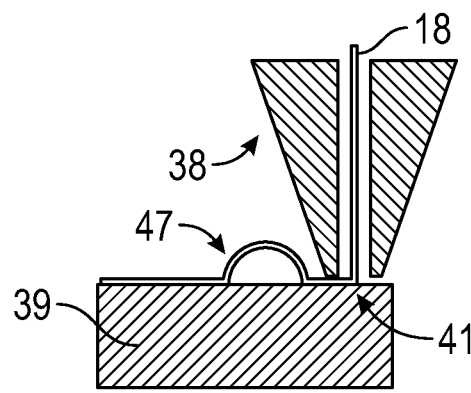
FIG. 5(a) illustrates an operation in which a middle portion of the wire pattern can be intentionally left outside the substrate to create a loop that may act as an access location functioning as, for example, probing or joining locations, in accordance with an alternative embodiment.
Figure 5B:
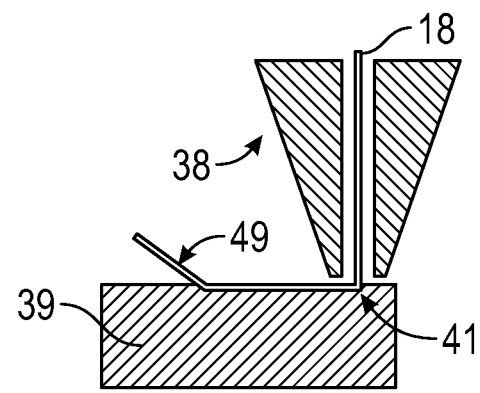
FIG. 5(b) illustrates an operation in which at the beginning or end of a wire pattern, a section of wire may also be left unembedded to act as a lead for an electrical connection, in accordance with an alternative embodiment.

It should be noted that the wire pattern does not have to be fully embedded in the plastics. For instance a middle portion of the wire pattern can be intentionally left outside the substrate to create a loop 47 that may act as a probing location as indicated in FIG. 5(*a*). At the beginning or end of a wire pattern, a section of wire 18 may also be left unembedded to act as a lead 49 for an electrical connection as shown in FIG. 5(*b*).

The problem of inconsistent 3D printed surfaces can be solved by utilizing distance sensors to measure the distance from the orifice and the substrate's surface. The sensor can be a laser distance sensor, optical distance sensor, contact displacement sensor, or similar device. During the embedding motion, the sensor leads the orifice and determines if there is a gap or interference between the orifice and the surface. Based on this feedback, a control system will actuate a stage that will move the tip accordingly to ensure a predefined distance between the orifice and the substrate's surface.

Figure 6:
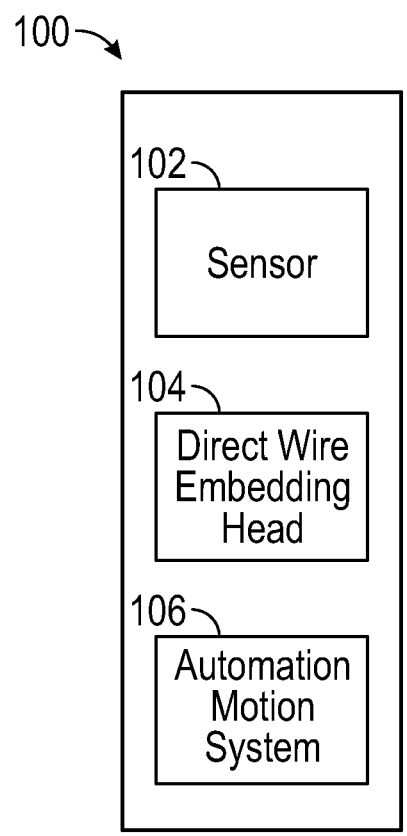
FIG. 6 illustrates a block diagram of a system for automatically dispensing and embedding components into three-dimensional parts, in accordance with an example embodiment.

FIG. 6 illustrates a block diagram of a system 100 for automatically dispensing and embedding components into three-dimensional parts, in accordance with an example embodiment. The system 100 can be implemented as an apparatus for automatically dispensing and embedding components into three-dimensional parts. The system includes, for example, a direct wire embedding head 104 fixed on an automation motion system 106. The direct wire embedding head 104 can begin and terminate an embedded wire pattern on a layer or on a surface of a three-dimensional part in order to automatically create said embedded wire pattern. The system 100 can further include a sensor 102 that tracks an embedding surface. Note that an example of sensor 102 is the distance sensor 36 shown in FIG. 2 located to left of the cooling nozzle 34.

The embedded wire pattern is embedded and the sensor 102 measures the distance between said direct wire embedding head 104 and the embedding surface. The predefined distance can be maintained to ensure successful embedding results for said embedded wire pattern by automatically adjusting a position of said direct wire embedding head 104 in response to feedback from said sensor 102.

Figure 7:
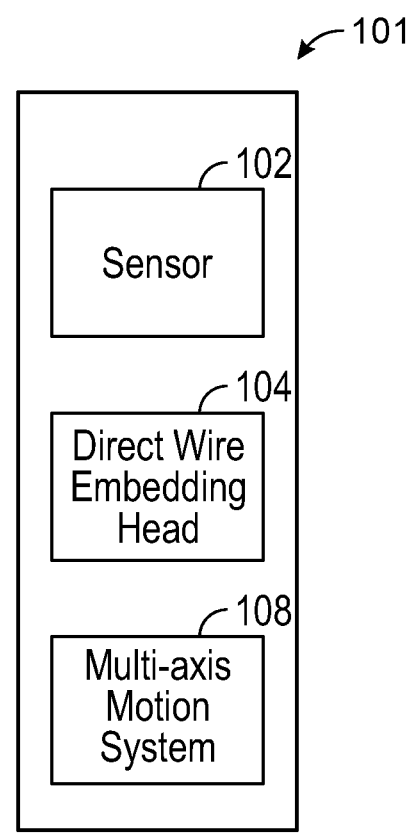
FIG. 7 illustrates a block diagram of a system for automatically dispensing and embedding components into three-dimensional parts, in accordance with another example embodiment.

FIG. 7 illustrates a block diagram of a system 101 for automatically dispensing and embedding components into three-dimensional parts, in accordance with another example embodiment. The system 101 shown in FIG. 7 is similar to the system 100 shown in FIG. 7 except that a multi-axis motion system 108 is utilized instead of the automation motion system 106 shown in FIG. 6. It can be appreciated in some embodiments the automation motion system 106 may comprise the multi-axis motion system 108.

Based on the foregoing, it can be appreciated that a number of example embodiments are disclosed herein, some of which are preferred embodiments and others alternative embodiments. For example, in a preferred example embodiment, an apparatus (or a system) can be implemented for automatically dispensing and embedding components into three-dimensional parts. The apparatus of such an example embodiment can include a direct wire embedding head fixed on an automation motion system, wherein the direct wire embedding head begins and terminates an embedded wire pattern on a layer or on a surface of a three-dimensional part in order to automatically create the embedded wire pattern.

In another example embodiment, a sensor can be included, which tracks an embedding surface wherein the embedded wire pattern is embedded, and wherein the sensor measures a distance between the direct wire embedding head and the embedding surface. In yet another example embodiment, a predefined distance can be maintained to ensure successful embedding results for the embedded wire pattern by automatically adjusting a position of the direct wire embedding head in response to feedback from the sensor. In some embodiments, the automation motion system can be implemented as a multi-axis motion system. In some embodiments, the embedded wire pattern can be composed of interconnections between electronic components, an electromagnetic device, a heating element, a heat dissipation element, and/or a mechanical reinforcement. In yet another embodiment, a cooling fluid can be used for active and selective cooling of a substrate and a wire. In still another embodiment, wire feeding during embedding of the embedded wire pattern can be implemented. In another example embodiment, at least one wire access point at a beginning, an end, or a middle of an embedded wire associated with the embedded wire pattern can be provided. In still another embodiment, a cutting wire component can be provided for terminating the embedded wire pattern. In some embodiments, the cutting wire component can be a cutter actuator connected to a knife bracket with respect to a cutting knife.

In another example embodiment, a method for automatically dispensing and embedding components into three-dimensional parts can be implemented. Such a method can include steps or operations for beginning and terminating via a directed wire embedding head fixed on an automation motion system, an embedded wire pattern on a layer, or on a surface of a three-dimensional part in order to automatically create the embedded wire pattern. In another example embodiment, a step or operation can be provided for measuring the distance between the direct wire embedding head and an embedding surface using a sensor that tracks the embedding surface wherein the embedded wire pattern is embedded.

In another example embodiment, a predefined distance can be maintained to ensure successful embedding results for the embedded wire pattern by automatically adjusting a position of the direct wire embedding head in response to feedback from the sensor. In such a methodology, the automation motion system can be implemented as a multi-axis motion system. In yet another method embodiment, the embedded wire pattern can include interconnections between electronic components, an electromagnetic device, a heating element, a heat dissipation element, and/or a mechanical reinforcement.

It will be appreciated that variations of the above-disclosed and other features and functions, or alternatives thereof, may be desirably combined into many other different systems or applications. It will also be appreciated various presently unforeseen or unanticipated alternatives, modifications, variations or improvements therein may be subsequently made by those skilled in the art, which are also intended to be encompassed by the following claims.

What is claimed is:

1. An apparatus for automatically dispensing and embedding components into three-dimensional parts, said apparatus comprising:
a direct wire embedding head fixed on an automation motion system, wherein said direct wire embedding head is configured to begin and terminate a wire for an embedded wire pattern on a layer or on a surface of a three-dimensional part in order to automatically create said embedded wire pattern, wherein the three-dimensional part comprises a plastic part, and wherein the direct wire embedding head comprises:
a wire feeder configured to feed wire during embedding of said embedded wire pattern;
a heating block connected to the wire feeder and configured to heat the wire and a portion of the plastic part to enable embedding the wire on the layer or on the surface of the three-dimensional part;
a switch sensor connected to the wire feeder to detect tension in the wire; and
a wire drive motor connected to the wire feeder and communicatively coupled to the switch sensor, the wire drive motor configured to adjust tension in the wire to prevent detachment of the wire from a molten plastic portion of the plastic part.

2. The apparatus of claim 1 further comprising a sensor configured to track an embedding surface wherein said embedded wire pattern is embedded, wherein said sensor is further configured to measure a distance between said direct wire embedding head and said embedding surface.

3. The apparatus of claim 2 wherein the direct wire embedding head is configured to maintain a predefined distance to ensure successful embedding results for said embedded wire pattern by automatically adjusting a position of said direct wire embedding head in response to feedback from said sensor.

4. The apparatus of claim 1 wherein said automation motion system comprises a multi-axis motion system.

5. The apparatus of claim 1 wherein the direct wire embedding head is configured to form said embedded wire pattern such that said embedded wire pattern comprises interconnections between electronic components, an electromagnetic device, a heating element, a heat dissipation element, and/or a mechanical reinforcement.

6. The apparatus of claim 1 further comprising a cooling fluid for active and selective cooling of a substrate and the wire.

7. The apparatus of claim 1 further comprising a cutting wire component for terminating said embedded wire pattern.

8. The apparatus of claim 7 wherein said cutting wire component comprises a cutter actuator connected to a knife bracket with respect to a cutting knife.

9. A system for automatically dispensing and embedding components into three-dimensional parts, said apparatus comprising:
a direct wire embedding head fixed on an automation motion system, wherein said direct wire embedding head is configured to begin and terminate a wire for an embedded wire pattern on a layer or on a surface of a three-dimensional plastic part in order to automatically create said embedded wire pattern;
a wire feeder configured to feed wire during embedding of said embedded wire pattern;
a heating block connected to the wire feeder and configured to heat the wire and a portion of the three-dimensional plastic part to enable embedding the wire on the layer or on the surface of the three-dimensional plastic part;
a switch sensor connected to the wire feeder to detect tension in the wire;
a wire drive motor connected to the wire feeder and communicatively coupled to the switch sensor, the wire drive motor configured to adjust tension in the wire to prevent detachment of the wire from a molten plastic portion of the three-dimensional plastic part; and
a sensor configured to track an embedding surface wherein said embedded wire pattern is embedded, wherein said sensor is further configured to measure a distance between said direct wire embedding head and said embedding surface.

10. The system of claim 9 wherein said automation motion system comprises a multi-axis motion system.

11. The system of claim 9 wherein said direct wire embedding head is configured to maintain a predefined distance to ensure successful embedding results for said embedded wire pattern by automatically adjusting a position of said direct wire embedding head in response to feedback from said sensor.

12. The system of claim 9 further comprising a cooling fluid for active and selective cooling of a substrate and a wire.

* * * * *